US010422036B2

(12) United States Patent
Xiao et al.

(10) Patent No.: US 10,422,036 B2
(45) Date of Patent: *Sep. 24, 2019

(54) SUPPRESSING AGING OF PLATINUM GROUP METAL PARTICLES IN A CATALYTIC CONVERTER

(71) Applicant: GM GLOBAL TECHNOLOGY OPERATIONS LLC, Detroit, MI (US)

(72) Inventors: Xingcheng Xiao, Troy, MI (US); Mei Cai, Bloomfield Hills, MI (US); Gongshin Qi, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 201 days.

This patent is subject to a terminal disclaimer.

(21) Appl. No.: 15/276,154

(22) Filed: Sep. 26, 2016

(65) Prior Publication Data

US 2017/0114458 A1    Apr. 27, 2017

Related U.S. Application Data

(60) Provisional application No. 62/245,544, filed on Oct. 23, 2015.

(51) Int. Cl.
*C23C 16/455* (2006.01)
*C23C 16/02* (2006.01)
(Continued)

(52) U.S. Cl.
CPC .... *C23C 16/45527* (2013.01); *C23C 16/0281* (2013.01); *C23C 16/04* (2013.01); *C23C 16/45555* (2013.01); *F01N 3/101* (2013.01); *F01N 3/103* (2013.01); *F01N 3/20* (2013.01); *F01N 3/2828* (2013.01);
(Continued)

(58) Field of Classification Search
CPC ................................................ C23C 16/45527
See application file for complete search history.

(56) References Cited

U.S. PATENT DOCUMENTS 5,856,263 A    1/1999  Bhasin et al.
6,022,825 A    2/2000  Anderson et al.
(Continued)

FOREIGN PATENT DOCUMENTS

CN        1090216 A      8/1994
CN       101602017 A    12/2009
(Continued)

OTHER PUBLICATIONS

O'Neill et al., Catalyst Design with Atomic Layer Deposition, Feb. 6, 2015, ACS Catalysis, 5, 1804-1825 (Year: 2015).*

(Continued)

*Primary Examiner* — Xiao S Zhao
(74) *Attorney, Agent, or Firm* — Harness, Dickey & Pierce, P.L.C.

(57) ABSTRACT

In an example of a method for suppressing aging of platinum group metal (PGM) particles in a catalytic converter, PGM particles are applied to a support. A surface of the PGM particles is passivated by exposing the PGM particles to carbon monoxide at a temperature equal to or less than 200° C. to introduce —CO groups to the surface. Atomic layer deposition (ALD) is performed to selectively grow a barrier on the support around the PGM particles.

19 Claims, 4 Drawing Sheets

(51) Int. Cl.
*F01N 3/20* (2006.01)
*F01N 3/10* (2006.01)
*C23C 16/04* (2006.01)
*F01N 3/28* (2006.01)

(52) U.S. Cl.
CPC ............ *F01N 2510/068* (2013.01); *F01N 2510/0682* (2013.01); *F01N 2510/0684* (2013.01); *Y02T 10/22* (2013.01)

(56) References Cited

U.S. PATENT DOCUMENTS

| | | |
|---|---|---|
| 7,323,432 B2 | 1/2008 | Niihara et al. |
| 7,659,224 B2 | 2/2010 | Shimazaki et al. |
| 7,964,167 B2 | 6/2011 | Kim et al. |
| 8,057,767 B1 | 11/2011 | Qi et al. |
| 8,211,392 B2 | 7/2012 | Grubert et al. |
| 8,226,915 B2 | 7/2012 | Qi et al. |
| 8,268,274 B2 | 9/2012 | Kim et al. |
| 8,318,119 B2 | 11/2012 | Qi et al. |
| 8,343,888 B2 | 1/2013 | Kim et al. |
| 8,349,761 B2 | 1/2013 | Xia et al. |
| 8,377,400 B2 | 2/2013 | Schmieg et al. |
| 8,404,201 B2 | 3/2013 | Qi et al. |
| 8,409,518 B2 | 4/2013 | Kim et al. |
| 8,466,083 B2 | 6/2013 | Schmieg et al. |
| 8,513,155 B2 | 8/2013 | Li et al. |
| 8,539,760 B2 | 9/2013 | Li et al. |
| 8,545,779 B2 | 10/2013 | Blint et al. |
| 8,906,331 B2 | 12/2014 | Koch et al. |
| 8,920,756 B2 | 12/2014 | Koch et al. |
| 8,943,811 B2 | 2/2015 | Li et al. |
| 8,959,894 B2 | 2/2015 | Qi et al. |
| 8,992,869 B2 | 3/2015 | Ratts et al. |
| 9,136,545 B2 | 9/2015 | Dadheech et al. |
| 9,186,654 B2 | 11/2015 | Qi et al. |
| 9,597,635 B2 | 3/2017 | Qi et al. |
| 9,732,687 B2 | 8/2017 | Li et al. |
| 9,863,922 B2 | 1/2018 | Qi et al. |
| 2002/0082163 A1 | 6/2002 | Yan et al. |
| 2004/0065078 A1 | 4/2004 | Schafer-Sindlinger et al. |
| 2009/0041645 A1 | 2/2009 | Wassermann et al. |
| 2010/0086832 A1 | 4/2010 | Lopez et al. |
| 2010/0204518 A1 | 8/2010 | Wolf et al. |
| 2011/0223096 A1 | 9/2011 | Wolf et al. |
| 2012/0042631 A1 | 2/2012 | Schmieg et al. |
| 2013/0034472 A1 | 2/2013 | Cantrell et al. |
| 2014/0057781 A1 | 2/2014 | Stamm Masias et al. |
| 2015/0140317 A1* | 5/2015 | Biberger ............ B01J 21/04 428/317.9 |
| 2015/0231566 A1 | 8/2015 | Xu et al. |
| 2015/0266014 A1 | 9/2015 | Xue et al. |
| 2015/0361913 A1 | 12/2015 | Qi et al. |
| 2016/0222852 A1 | 8/2016 | Ren et al. |

FOREIGN PATENT DOCUMENTS

| | | |
|---|---|---|
| CN | 103974759 | 8/2014 |
| CN | 106607103 A | 5/2017 |
| DE | 102009010279 A1 | 10/2009 |
| DE | 102016220413 A1 | 4/2017 |
| EP | 1250952 A1 | 10/2002 |
| EP | 0695580 | 3/2003 |
| GB | 2455993 A | 7/2009 |
| GB | 2522978 | 8/2015 |
| JP | 2006192357 | 7/2006 |
| JP | 2009247968 | 10/2009 |
| JP | 2011230104 | 11/2011 |
| JP | 05747952 | 7/2015 |
| JP | 05806536 | 11/2015 |
| KR | 2011001004 | 1/2011 |
| KR | 1092606 | 12/2011 |
| WO | WO2007063615 | 6/2007 |
| WO | WO-2011066199 A1 | 6/2011 |
| WO | WO2013182302 | 12/2013 |

OTHER PUBLICATIONS

First Office Action and Search Report for China Patent Application No. 201610908992.7 dated Oct. 8, 2018, 5 pages.

First Office Action for German Patent Application No. 102016220413.0 dated Oct. 30, 2018 and correspondence dated Nov. 5, 2018 from Manitz Finsterwald Patentanwälte PartmbB summarizing contents, 7 pages.

Chen, et al; "Development of low temperature three-way catalysts for future fuel effecient vehicles"; Johnson Matthey Technol. Rev.; 2015; vol. 59; (1); pp. 64-67.

Chang, et al.; "Gasoline cold start concept (gCSC) technology for low temperature emission control"; SAE Int. J. Fuels Labr. 7(2); 2014 pp. 480-488.

Dai, et al.; "A sinter-resistant Catalytic system based on platinum nanoparticles supported on TiO2 nanofibers and covered by porous silica"; Angew. Chem.Int. Ed.; 2010; vol. 49 pp. 8165-8168.

Lu, et al.; "Coking- and sintering-resistant palladium catalysts achieved through atomic layer deposition" Science; 2012; vol. 335; No. 6073; pp. 1205-1208 Abstract Only.

Pan, et al. "Effect of alumina on structure and acidity of solid acid catalyst Pt-SO_4~(2-)/ZrO_2-Al_20_3"; Chinese Journal of Catalysis; 2005; Abstract Only.

Wang; "Fabrication and testing of low-temperature catalytically active washcoat materials for next-generation vehicle catalytic converters"; YSU-CTME; 2013; pp. 1-9.

Li, et al.; "A sintering-resistant Pd/SiO2 catalyst by reverse-loading nano iron oxide for aerobic oxidation of benzyl alcohol"; RSC Advances; 2015; vol. 5; pp. 4766-4769; Abstract Only.

Lu, et al.; A sinter-resistant catalytic system fabricated by maneuvering the selectivity of SiO2 deposition onto the Tio2 surface versus the pt nanoparticle surface Nano Lett.; 2013; vol. 13 (10); pp. 4957-4962; Abstract Only.

* cited by examiner

SUPPRESSING AGING OF PLATINUM GROUP METAL PARTICLES IN A CATALYTIC CONVERTER

CROSS-REFERENCE TO RELATED APPLICATIONS

This application claims the benefit of U.S. Provisional Application Ser. No. 62/245,544, filed Oct. 23, 2015, which is incorporated by reference herein in its entirety.

TECHNICAL FIELD

The present disclosure relates generally to catalytic converters, and more specifically to age-suppressing of platinum group metal (PGM) particles in a catalytic converter.

BACKGROUND

Vehicles with an Internal Combustion Engine (ICE) include an exhaust gas treatment system for treating the exhaust gas from the engine. The configuration of the treatment system depends, in part, upon whether the engine is a diesel engine (which typically operates with lean burn combustion and contains high concentrations of oxygen in the exhaust gases at all operating conditions) or a stoichiometric spark-ignited engine (which operates at a nearly stoichiometric air-to-fuel (A/F) ratio). The treatment system for the diesel engine includes a diesel oxidation catalyst (DOC), which is capable of oxidizing carbon monoxide (CO) and hydrocarbons (HC). The treatment system for the stoichiometric spark-ignited engine includes a three-way catalyst (TWC), which operates on the principle of non-selective catalytic reduction of $NO_x$ by CO and HC.

SUMMARY

In an example of a method for suppressing aging of platinum group metal (PGM) particles in a catalytic converter, PGM particles are applied to a support. A surface of the PGM particles is passivated by exposing the PGM particles to carbon monoxide at a temperature equal to or less than 200° C. to introduce —CO groups to the surface. Atomic layer deposition (ALD) is performed to selectively grow a barrier on the support around the PGM particles.

In another example of a method for suppressing aging of PGM particles in a catalytic converter, PGM particles are applied to a support. A modified ALD process is performed to selectively grow a first layer of a barrier on the support around the PGM particles. During the modified ALD process, the PGM particles and the support are exposed to a reducing gas at a temperature ranging from 150° C. to 500° C. or to carbon monoxide at a temperature greater than 200° C. to remove —O and —OH groups from a surface of the PGM particles and to leave at least some —OH groups on a surface of the support intact. The reducing gas is selected from the group consisting of hydrogen gas, carbon monoxide, ammonia, anhydrous ammonia, aqueous ammonia, urea, and mixtures thereof. The PGM particles and the support are exposed to a metal oxide precursor or a mixed metal oxide precursor using a hydrogen-containing carrier gas and are exposed to water vapor. The modified ALD process is repeated to selectively grow a subsequent layer of the barrier.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Figure 1:
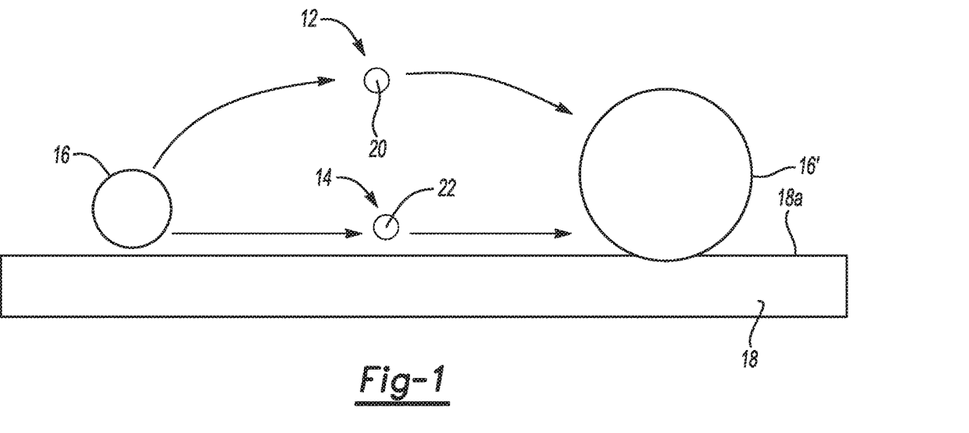
FIG. 1 is a schematic illustration depicting two mechanisms for PGM particle growth or sintering.

DOCs and TWCs often include a support loaded with a Platinum Group Metal (PGM) as the active catalytic/catalyst material. As the exhaust gas temperature from the vehicle engine increases (e.g., to temperatures ranging from 150° C. to about 1000° C.), the PGM loaded on the support may experience particle growth (i.e., sintering). FIG. 1 depicts two mechanisms for PGM particle growth during vehicle operation. The mechanisms involve atomic and/or crystallite PGM migration. The first mechanism involves PGM migration via a vapor phase, denoted 12, and the second mechanism involves PGM migration via surface diffusion, denoted 14. In the first mechanism, a mobile species (not shown), emitted from the PGM particles 16 loaded on the support 18, can travel through the vapor phase 12 and agglomerate with other metal particles 20 in the vapor phase 12 to form larger PGM particles 16'. In the second mechanism, a mobile species (not shown) emitted from the PGM particles 16 can diffuse along the surface 18a of the support 18 and agglomerate with other metal particles 22 on the surface 18a to form larger PGM particles 16'.

An increase in the size of the PGM particles 16' results in poor PGM utilization and undesirable aging of the catalyst material. More specifically, the increased particle size reduces the PGM dispersion, which is a ratio of the number of surface PGM atoms in the catalyst to the total number of PGM atoms in the catalyst. A reduced PGM dispersion is directly related to a decrease in the active metal surface area (as a result of particle growth), and thus indicates a loss in active catalyst reaction sites. The loss in active catalyst reaction sites leads to poor PGM utilization efficiency, and indicates that the catalyst has undesirably been aged or deactivated.

It has been observed that about 1% of the PGM in a typical TWC remains catalytically active after 100,000 to 150,000 miles of driving (i.e., 99% of the PGM is wasted). One approach to counteract the effect of sintering is to use a high enough PGM loading to compensate for the catalyst deactivation. However, this increases the cost of the TWC.

The catalysts disclosed herein suppress aging by physically separating the PGM particles 16 with a barrier formed on the support 18. By physically separating the PGM particles 16, the barrier aims to block vapor phase migration and surface diffusion. This slows down or prevents the PGM particle growth/sintering and maintains more active PGM sites over time, and thus the catalyst ages slower than catalysts without the barrier. Moreover, when sintering is reduced or prevented, the operational temperature of the catalyst is prevented from drifting upward over time.

Figure 2A:
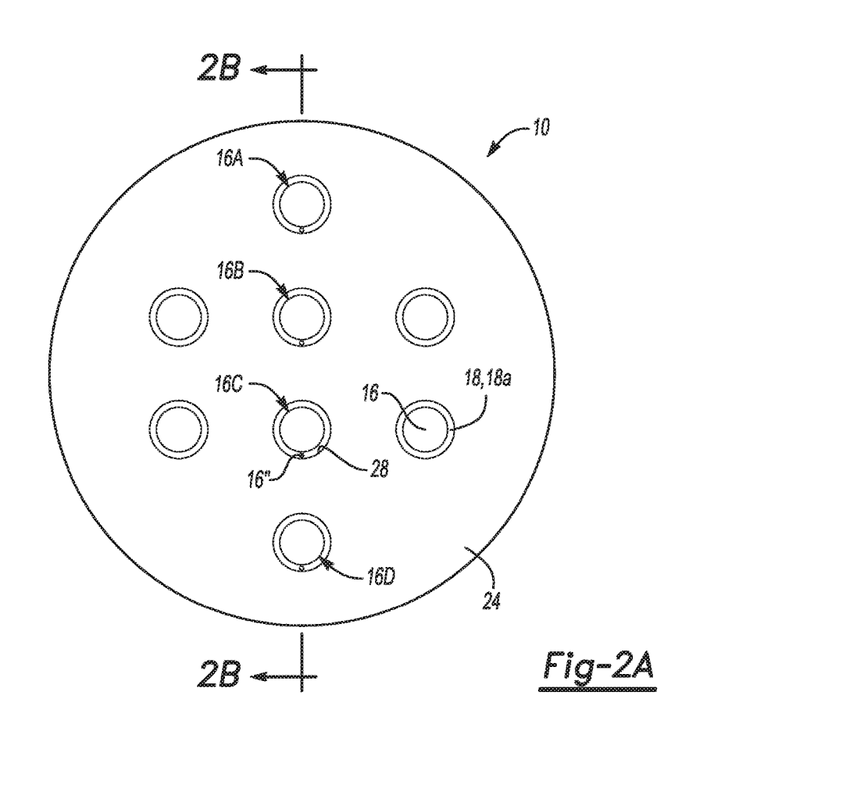
FIG. 2A is a semi-schematic, top view of an example of a catalyst disclosed herein.
Figure 2B:
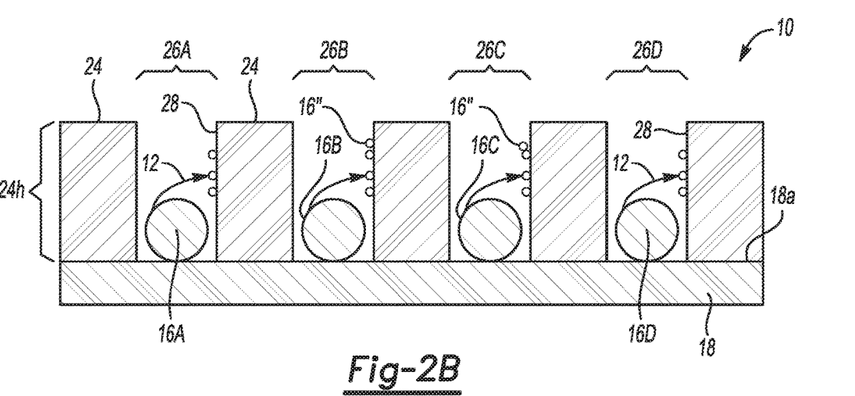
FIG. 2B is a semi-schematic, cross-sectional view taken along line 2B-2B of the catalyst shown in FIG. 2A.

Referring now to FIGS. 2A and 2B, an example of the catalyst 10 is depicted. More specifically, FIG. 2A depicts a top view of the catalyst 10, and FIG. 2B depicts a cross-sectional view of the catalyst 10.

The catalyst 10 includes the support 18. The support 18 may be a porous metal oxide structure. The porous metal oxide structure may be formed of $Al_2O_3$, $CeO_2$, $ZrO_2$, $CeO_2$—$ZrO_2$, $SiO_2$, $TiO_2$, MgO, ZnO, BaO, $K_2O$, $Na_2O$, CaO, or combinations thereof. The support 18 may also have a perovskite structure, such as $La_{0.9}FeO_3$, $LaFeO_3$, $LaAlO_3$, Sr-promoted $LaFeO_3$, Ce-promoted $LaFeO_3$, $LaMnO_3$, or $LaCoO_3$. The support 18 may be in the form of a powder, spheres, or any other suitable configuration. The support 18 may include several small pores. More pores increase the surface area to fit many PGM particles 16 in a small volume. In an example, the pore volume of the support 18 ranges from about 0.5 ml/g to about 2 ml/g.

The catalyst 10 also includes PGM particles 16 applied to (e.g., dispersed on) the support 18. By "dispersed on", it is meant that the PGM particles 16 may be bonded to the surface 18a of the support 18, and may also be present within the pores (not shown) of the support 18.

In FIGS. 2A and 2B, each instance or occurrence 16A, 16B, 16C, 16D of the PGM particles 16 on the surface 18a is shown as a single PGM particle. However, it is to be understood that each instance or occurrence 16A, 16B, 16C, 16D of the PGM particles 16 may include several PGM particles 16 agglomerated together. For example, each instance or occurrence 16A, 16B, 16C, 16D may include a small cluster of the particles 16, with the particles 16 being similarly sized or having a distribution in particle size. For another example, each instance or occurrence 16A, 16B, 16C, 16D may include an individual particle 16 that is isolated from each other individual particle 16 by the barrier 24.

The PGM particles 16 are formed of active catalytic material, and may be palladium (Pd), platinum (Pt), rhodium (Rh), ruthenium (Ru), osmium (Os), iridium (Ir), or various combinations thereof (e.g., Pd and Pt, Pt and Rh, Pd and Rh, Pd, Pt and Rh, Pt and Ir, Pd and Os, or any other combination). The PGM particles 16 are present in the catalyst 10 in an amount ranging from about 0.1 wt % to about 10 wt % of the catalyst 10.

The catalyst 10 also includes the barrier 24 formed on at least some of the surface 18a of the support 18 (e.g., on those areas where the PGM particles 16 are not present). As shown in FIG. 2B, the barrier 24 physically separates each instance or occurrence 16A, 16B, 16C, 16D of the PGM particles 16 from each other instance or occurrence 16A, 16B, 16C, 16D of the PGM particles 16. The barrier 24 essentially forms a wall between the PGM catalyst particles 16 on the surface 18a of the support 18, and functions to prevent the particles 16 from agglomerating through either the vapor phase 12 or surface diffusion 22. The barrier 24 does not extend onto any of the PGM particles 16, and thus the PGM particles 16 can be exposed directly to the exhaust gas during vehicle operation. As shown in FIG. 2A, the barrier 24 may be a continuous coating formed around each instance or occurrence 16A, 16B, 16C, 16D of the PGM particles 16.

The barrier 24 may be any of $Al_2O_3$, $CeO_2$, $ZrO_2$, $CeO_2$—$ZrO_2$, $SiO_2$, $TiO_2$, MgO, ZnO, BaO, CaO, $La_{0.9}FeO_3$, $LaFeO_3$, $LaAlO_3$, Sr-promoted $LaFeO_3$, Ce-promoted $LaFeO_3$, $LaMnO_3$, $LaCoO_3$, or combinations thereof. In an example, the support 18 is $CeO_2/Al_2O_3$, and the barrier 24 is $Al_2O_3$.

To prevent particle 16 migration, the barrier 24 has a height 24h that ranges from about 0.05X to about 10X, where X is a dimension of at least one of the PGM particles 16. In an example, the dimension of at least one of the PGM particles 16 is a diameter or a width of a single particle 16 or of an agglomeration/cluster of particles 16. In another example, the dimension of at least one of the PGM particles 16 is a height of a single particle 16 or an agglomeration/cluster of particles 16. The height 24h of the barrier 24 may be selected so that the barrier 24 is tall enough to prevent or suppress migration, and short enough so that the barrier 24 does not begin to cover the neighboring PGM particle(s) 16 and does not impede access of the exhaust gas to the PGM particles 16. In an example, if the particle 16 size ranges from about 3 nm to about 5 nm, the height 24h of the barrier may range from about 0.15 nm (0.05×3) to about 50 nm (10×5).

The barrier 24 also creates spaces 26A, 26B, 26C, 26D, each of which is occupied by a respective PGM particle 16. The height of the space 26A, 26B, 26C, 26D corresponds with the height 24h of the barrier 24, while at least one other dimension (e.g., length, width, diameter, or the like) of the spaces 26A, 26B, 26C, 26D depends on the size of instance or occurrence 16A, 16B, 16C, 16D of the PGM particle 16 in the respective space. In an example, the dimension(s) (other than height) of the spaces 26A, 26B, 26C, 26D is/are up to about 100 nm, which can accommodate larger particles 16 or particle agglomerations/clusters. In another example, the dimension(s) (other than height) of the spaces 26A, 26B, 26C, 26D ranges from about 3 nm to about 5 nm (e.g., the diameter of the particles 16).

The barrier 24 blocks surface diffusion of PGM particles 16. Further, the barrier 24 suppresses PGM growth via vapor phase migration. Any mobile species from the PGM particles 16 that migrates via the vapor phase 12 may become deposited (as particles 16") on the side walls 28 of the barrier 24. These PGM particles 16" remain catalytically active.

The catalyst 10 may be formed by the different methods disclosed herein. Each of the methods involves a modified atomic layer deposition (ALD) process. One example is shown in FIGS. 3A-3D and other examples are shown in FIGS. 4A-4E. These methods maintain the PGM particles 16 in a metal state or a passivated state, so as to avoid any —OH groups or other species that could initiate ALD growth on the surface of the particles 16.

The method shown in FIGS. 3A-3D depicts the use of a reducing gas to release oxygen (—O) atoms and/or hydroxyl (—OH) groups from the surface of the PGM particles 16. The removal of these atoms and groups renders the particles 16 non-reactive during subsequent barrier formation via ALD.

Figure 3A:
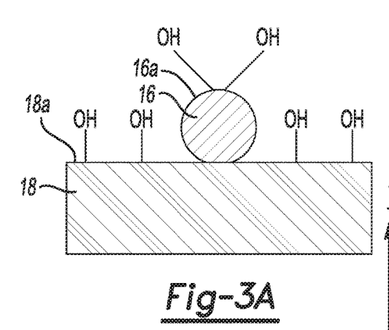
FIGS. 3A-3D are cross-sectional schematic views which together depict one example of the method disclosed herein.

As shown in FIG. 3A, the method involves applying the PGM particles 16 to the support 18. The PGM particles 16 may be applied to the support 18 using an impregnation process. Impregnating the PGM particles 16 onto the support 18 utilizes a PGM precursor solution. The PGM precursor solution may be an aqueous solution containing water and a PGM precursor. Any number of PGM containing coordination complexes can be used as the PGM precursor. Some example PGM precursors include chloroplatinic acid (CPA), tetraammineplatinum chloride (or nitrate or hydroxide), platinum nitrate, platinum acetate, dinitrodiamine platinum, palladium nitrate, palladium acetate, bis-acetylacetonato palladium, rhodium nitrate, rhodium acetate, ruthenium (III) chloride, ruthenium (III) acetylacetonate, ruthenium (II) hexa-ammine dichloride, ruthenium (III) hexa-ammine trichloride, osmium (III) chloride hydrate, ammonium hexachloroosmate (IV), iridium (IV) chloride, ammonium hexachloroiridate, iridium (III) chloride, iridium sulfate, etc. Any of these precursors may be added to water to form the PGM precursor solution. Examples of the PGM precursor solution include a platinum nitrate solution, a platinum acetate solution, a palladium nitrate solution, a palladium acetate solution, a rhodium nitrate solution, a rhodium acetate solution, or combinations thereof. The combinations may be used to form mixtures of different types of PGM particles 16 (e.g., a mixture of platinum and palladium particles).

The concentration of the precursor solution depends upon the desired loading of the PGM particles 16 on the support 18 and in the catalyst 10. For example, 10 g total of the catalyst 10 with 1.5% platinum equates to 0.15 g platinum (i.e., 1.5% of 10 g). The mass ratio of pure platinum to platinum precursor may be used to determine how much of the platinum precursor should be used to achieve the desired mass of platinum for the catalyst 10. For dry impregnation, the total amount of water added to make the aqueous solution depends upon the volume of water that will fill the pore volume, i.e., achieve incipient wetness. For wet impregnation, the total amount of water added to make the aqueous solution depends upon the solubility of the PGM precursor. In this example, this solution may be added to 9.85 g of dried support (i.e., 10 g total–0.15 g platinum=g support).

For dry impregnation, the PGM precursor solution is added to the support 18 until all of the pores of the support 18 are filled with the solution. No additional solution is added beyond the amount needed to fill the pores (i.e., incipient wetness). Capillary action draws the PGM precursor solution into the pores.

For wet impregnation, the support 18 is first filled with the same solvent (e.g., water) that is used for the PGM precursor solution. The wetted support 18 is then treated with the PGM precursor solution. In this example, high pressure is not developed in the pores of the support 18, but rather the PGM precursor migrates progressively from the PGM solution into the pores.

The impregnated support 18 is then exposed to drying to remove the water and calcining to convert the PGM precursor to the PGM particles 16. Drying may be performed in air at a temperature ranging from about room temperature (e.g., 18° C. to about 25° C.) to about 150° C. for a time period ranging from about 12 hours to about 24 hours, and calcining may be performed at a temperature ranging from about 300° C. to about 650° C. for a time period ranging from about 1 hour to about 4 hours. In an example, calcining is performed at about 550° C. for about 2 hours. This process decomposes the PGM precursor and forms the PGM particles 16 both within the pores of the support 18 and on at least some of the surface 18a of the support 18.

As depicted in FIG. 3A, both the PGM particle(s) 16 and the support 18 have —OH groups on their respective surfaces 16a, 18a. Each of these surfaces 16a, 18a may also have —O atoms attached thereto. A modified ALD process is performed to remove the —O and/or —OH groups from the surface 16a of the particle 16 while leaving the —O and/or —OH groups on the surface 18a intact (shown in FIG. 3B), and to form a first layer 24A of the barrier 24 (shown in FIGS. 3C and 3D).

Figure 3B:
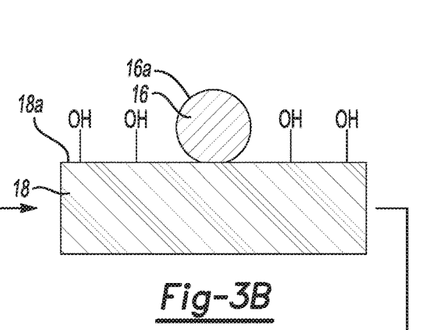

The modified ALD process begins with exposing the PGM particle(s) 16 and the support 18 to a reducing gas at a temperature ranging from 150° C. to about 500° C. or to carbon monoxide gas at a temperature ranging greater than 200° C. for a time ranging from about 0.5 hours to about 10 hours. At these temperatures, a catalytic effect (which reduces the surface —O and/or —OH groups) takes place at the PGM particle surface 16a, and may not take place at the support surface 18a. As such, this process may reduce —O atoms and/or —OH groups on the surface 16a of the PGM particles 16, and may not deleteriously affect at least some of the —O atoms and/or —OH groups on the exposed surface 18a of the support 18. As a result of this process, the PGM particles 16 will not react during the subsequent ALD steps, and at least some of the —O atoms and/or —OH groups on the exposed surface 18a of the support 18 remain reactive during the subsequent ALD steps.

The reducing gas may be hydrogen gas ($H_2$ as shown between FIGS. 3A and 3B), ammonia ($NH_3$), anhydrous ammonia, aqueous ammonia, urea, and mixtures thereof. The reducing gas or carbon monoxide may be introduced alone, or it may be entrained in a carrier gas, such as Ar, He, Ne, Kr, Xe, Rn, $N_2$, and the like. The concentration of the reducing gas or carbon monoxide may range from about 2 volume percent (vol %) to about 100 vol %. In examples in which the concentration of the reducing gas or carbon monoxide is less than 100 vol %, it is to be understood that the balance of the gas flow is the carrier gas.

The flow rate of the reducing gas or carbon monoxide (either alone or in combination with the carrier gas) may range from about 5 standard cubic centimeters per minute (sccm) to about 50 sccm.

As shown between FIGS. 3A and 3B, the support 18 having the PGM particles 16 dispersed thereon is exposed to hydrogen gas. While not shown, it is to be understood that the support 18 having the PGM particles 16 dispersed thereon may be introduced into a chamber, and the various steps of the modified ALD process may take place within the chamber. In the example shown in FIGS. 3A and 3B, the hydrogen gas interacts with the —OH groups on the PGM particle 16 as follows:

$$H_2 \rightarrow 2H^* \tag{1}$$

$$OH + H^* \rightarrow H_2O. \tag{2}$$

The water may be evaporated from the chamber as a result of the high temperature, or may otherwise be removed from the chamber. As depicted in FIG. 3B, the surface 16a of the PGM particle(s) 16 is clean (i.e., free of surface —OH and/or —O).

The modified ALD process then includes exposing the clean PGM particles 16 and the support 18 to a metal oxide precursor or a mixed metal oxide precursor (shown between FIGS. 3B and 3C), and then to water vapor (shown between FIGS. 3C and 3D) to form the first layer 24A of the barrier 24. Each of these exposure steps is self-limiting, because they involve sequential surface chemical reactions with certain functional groups (e.g., —OH). Since the PGM particles 16 have been treated to reduce or otherwise remove these reactive functional groups, the first layer 24A of the barrier 24 does not form on the PGM particles 16.

Figure 3C:
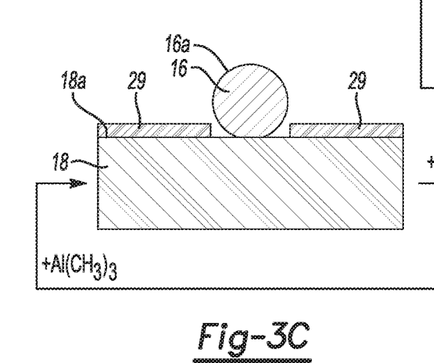
Figure 3D:
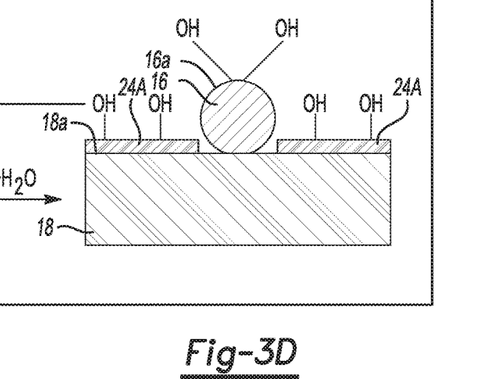

Each of the exposure steps from FIGS. 3B to 3D may be performed at a temperature ranging from room temperature (e.g., from about 18° C. to about 25° C.) to about 250° C., with gas flows, such as Ar, He, or other inert gases, within a range of about 5 sccm to about 50 sccm. The temperature of the precursor materials and the water vapor may range from about room temperature to about 100° C.

As shown between FIGS. 3B and 3C, the clean PGM particles 16 and the support 18 are first exposed to a metal oxide precursor or a mixed metal oxide precursor. The metal oxide precursor shown in the FIGS. 3A-3B is $Al(CH_3)_3$ (i.e., trimethylaluminum). It is to be understood that the metal oxide precursor or the mixed metal oxide precursor that is used will depend upon the desired composition for the barrier 24. As mentioned above, the barrier 24 may be any of $Al_2O_3$, $CeO_2$, $ZrO_2$, $CeO_2$—$ZrO_2$, $SiO_2$, $TiO_2$, MgO, ZnO, BaO, CaO, $La_{0.9}FeO_3$, $LaFeO_3$, $LaAlO_3$, Sr-promoted $LaFeO_3$, Ce-promoted $LaFeO_3$, $LaMnO_3$, $LaCoO_3$, or combinations thereof.

To form the layer 24A (and ultimately the barrier 24) of $Al_2O_3$, the precursor may be trimethylaluminum, triisobutylaluminum, tris(dimethylamido)aluminum(III), aluminum tris(2,2,6,6-tetramethyl-3,5-heptanedionate), or combinations thereof.

To form the layer 24A (and ultimately the barrier 24) of $CeO_2$, the precursor may be tris(i-propylclopentadienyl)cerium.

To form the layer 24A (and ultimately the barrier 24) of $ZrO_2$, the precursor may be bis(cyclopentadienyl)zirconium(IV) dihydride, bis(methyl-$\eta^5$-cyclopentadienyl)methoxymethylzirconium, dimethylbis(pentamethylcyclopentadienyl)zirconium(IV), tetrakis(dimethylamido)zirconium(IV), tetrakis(ethylmethylamido)zirconium(IV), zirconium(IV) dibutoxide(bis-2,4-pentanedionate) solution, zirconium(IV) 2-ethylhexanoate, zirconium tetrakis(2,2,6,6-tetramethyl-3,5-heptanedionate), or combinations thereof.

The $CeO_2$—$ZrO_2$ layer 24A and barrier 24 may be formed with combinations of the $CeO_2$ precursor and one or more of the $ZrO_2$ precursors.

To form the layer 24A (and ultimately the barrier 24) of $SiO_2$, the precursor may be (3-aminopropyl)triethoxysilane, N-sec-butyl(trimethylsilyl)amine, chloropentamethyldisilane, 1,2-dichlorotetramethyldisilane, 1,3-diethyl-1,1,3,3-tetramethyldisilazane, 1,2-dimethyl-1,1,2,2-tetraphenyldisilane, dodecamethylcyclohexasilane, hexamethyldisilane, 2,4,6,8,10-pentamethylcyclopentasiloxane, pentamethyldisilane, silicon tetrabromide, silicon tetrachloride, tetraethylsilane, 2,4,6,8-tetramethylcyclotetrasiloxane, 1,1,2,2-tetramethyldisilane, tetramethylsilane, N,N',N''-tri-tert-butylsilanetriamine, tris(tert-butoxy)silanol, tris(tert-pentoxy)silanol, or combinations thereof.

To form the layer 24A (and ultimately the barrier 24) of $TiO_2$, the precursor may be tetrakis(diethylamido)titanium(IV), tetrakis(dimethylamido)titanium(IV), tetrakis(ethylmethylamido)titanium(IV), titanium(IV) diisopropoxidebis(2,2,6,6-tetramethyl-3,5-heptanedionate), titanium(IV) isopropoxide, titanium tetrachloride, or combinations thereof.

To form the layer 24A (and ultimately the barrier 24) of MgO, the precursor may be bis(cyclopentadienyl)magnesium(II) and/or bis(pentamethylcyclopentadienyl)magnesium.

To form the layer 24A (and ultimately the barrier 24) of ZnO, the precursor may be bis(pentafluorophenyl)zinc, bis(2,2,6,6-tetramethyl-3,5-heptanedionato)zinc(II), diethylzinc, or combinations thereof.

To form the layer 24A (and ultimately the barrier 24) of BaO, the precursor may be barium bis(2,2,6,6-tetramethyl-3,5-heptanedionate) hydrate, barium nitrate, bis(pentamethylcyclopentadienyl)barium tetrahydrofuran adduct, bis(triisopropylcyclopentadienyl)barium tetrahydrofuran adduct, or combinations thereof.

To form the layer 24A (and ultimately the barrier 24) of CaO, the precursor may be calcium bis(6,6,7,7,8,8,-heptafluoro-2,2-dimethyl-3,5-octanedionate), calcium bis(2,2,6,6-tetramethyl-3,5-heptanedionate), or combinations thereof.

Any combinations of the previously listed metal oxide precursors may be used together to form a mixed metal oxide. Other mixed metal oxide precursors may be used to form the previously mentioned perovskite structure metal oxides (e.g., $La_{0.9}FeO_3$, $LaFeO_3$, $LaAlO_3$, Sr-promoted $LaFeO_3$, Ce-promoted $LaFeO_3$, $LaMnO_3$, and $LaCoO_3$). To form these metal oxides as the layer 24A and barrier 24, the mixed metal oxide precursors include a lanthanum precursor and another metal oxide precursor selected from the group consisting of an iron precursor, an aluminum precursor, a cerium precursor, a strontium precursor, a manganese precursor, a cobalt precursor, and combinations thereof. Any of the previously listed aluminum and cerium precursors may be used. Examples of the other precursors include the following: lanthanum(III) isopropoxide, tris[N,N-bis(trimethylsilyl)amide]lanthanum(III), tris(cyclopentadienyl)lanthanum(III), and/or tris(tetramethylcyclopentadienyl)lanthanum(III) as lanthanum precursors; [1,1'-bis(diphenylphosphino)ferrocene]tetracarbonylmolybdenum(0), bis(pentamethylcyclopentadienyl)iron(II), 1,1'-diethylferrocene, iron(0) pentacarbonyl, and/or iron(III) tris(2,2,6,6-tetramethyl-3,5-heptanedionate) as iron precursors; strontium tetramethylheptanedionate anhydrous as a strontium precursor; bis(pentamethylcyclopentadienyl)manganese(II), bis(tetramethylcyclopentadienyl)manganese(II), bromopentacarbonylmanganese(I), ethylcyclopentadienylmanganese(I) tricarbonyl, cyclopentadienylmanganese(I) tricarbonyl, and/or manganese(0) carbonyl as manganese precursors; and/or bis(cyclopentadienyl)cobalt(II), bis(ethylcyclopentadienyl)cobalt(II), and/or bis(pentamethylcyclopentadienyl)cobalt(II) as cobalt precursors.

When exposed to the metal oxide or mixed metal oxide precursor(s), the precursor(s) reacts with —OH groups on the support 18 to form an intermediate 29 on the exposed portions of the surface 18a. In the example using $Al(CH_3)_3$ as the metal oxide precursor, the $Al(CH_3)_3$ reacts with —OH groups on the support 18, and forms Al—$(CH)_2$ (the intermediate 29) on the exposed portions of the surface 18a.

Then (as shown between FIGS. 3C and 3D), water is introduced. The water is in the form of water vapor, which reacts with the intermediate 29 and forms the desired metal oxide or mixed metal oxide with surface —OH groups. After this, one cycle of the modified ALD process is completed and one layer 24A of the barrier 24 is formed.

More specifically, the starting components for the formation of the layer 24A shown in FIGS. 3A-3D include $Al(CH_3)_3$ and water. The overall reaction with these particular starting components is shown as reaction (3) and the half-reactions are shown as reactions (4) and (5):

$$2Al(CH_3)_3 + 3H_2O \rightarrow Al_2O_3 + 6CH_4 \qquad (3)$$

$$Al(CH_3)_{3(g)} + :Al-O-H_{(s)} \rightarrow :Al-O-Al(CH_3)_{2(s)} + CH_4 \qquad (4)$$

$$2H_2O_{(g)} + :O-Al(CH_3)_{2(s)} : Al-O-Al(OH)_{2(s)} + 2CH_4. \qquad (5)$$

The reactions rely on the presence of —OH bonds on the surface 18a of the support 18. Over many cycles, alternating layers of oxygen and aluminum are formed on the surface

18*a*, resulting in a hydroxylated $Al_2O_3$ surface. As noted above, ALD is a self-limiting surface reaction process. For example, in the first half cycle, $Al(CH_3)_3$ reacts with —OH groups on the support 18, and forms Al—$(CH)_2$ on the exposed portions of the surface 18*a*. Then, water is introduced, which reacts with Al—$(CH)_2$ and forms Al—OH again. After this, one cycle is completed and a layer (e.g., 24A) of $Al_2O_3$ is formed.

The (mixed) metal oxide precursor(s) and the water vapor are inserted (e.g., into the chamber including the support 18 having the PGM particle(s) 16 dispersed thereon) as a series of sequential, non-overlapping pulses. In each of these pulses, the precursor and water vapor molecules react with the surface in a self-limiting way, so that the reaction terminates once all the reactive sites (e.g., —OH groups) on the surface 18*a* are consumed.

The nature of the modified ALD process shown in FIGS. 3A-3D is that it deposits one monolayer (e.g., layer 24A) per cycle. The monolayer 24A is a conformal (or continuous) coating on the exposed surface 18*a*. The process precisely controls the thickness of each layer 24A that is formed. For example, 1 cycle of modified ALD creates a conformal layer 24A having a thickness of about 1.1 Angstroms.

As shown in FIG. 3D, during the process, —OH groups may be reintroduced on the surface 16*a* of the PGM particle 16. As such, each of the exposing steps (i.e., exposure to the reducing gas, then to the metal oxide precursor(s), and then to water vapor) may be repeated as many times as desired to build up several layers of the metal oxide or mixed metal oxide and to form the barrier 24 around (and not on) the PGM particles 16. It is to be understood that the temperature used during the repeated reduction process is not high enough to initiate the catalytic effect at the surface of the barrier layer 24A, and thus will not remove the —OH groups therefrom. As such, subsequent cycles of the modified ALD process will build the barrier 24 on previously formed layers 24A that are positioned around, but not on, the PGM particles 16.

Referring now to FIGS. 4A-4E, another example of the method is depicted. This example depicts the use of carbon monoxide to passivate the surface 16*a* of the PGM particles 16 with —CO groups. The introduction of —CO groups renders the particles 16 non-reactive during subsequent barrier formation via ALD.

Figure 4A:
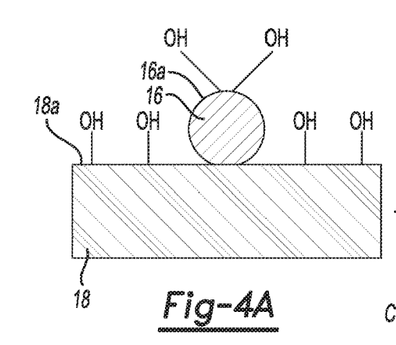
FIGS. 4A-4E are cross-sectional schematic views which together depict another example of the method disclosed herein.

FIG. 4A illustrates the PGM particle(s) 16 applied to the surface 18*a* of the support 18. The PGM particles 16 may be any of the PGMs previously described and may be formed via any of the methods described in reference to FIG. 3A.

Figure 4B:
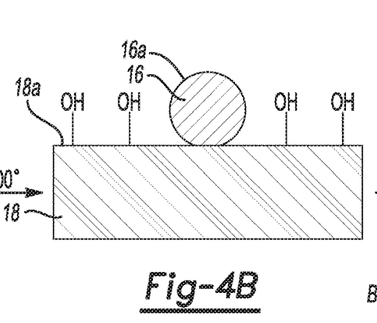
Figure 4C:
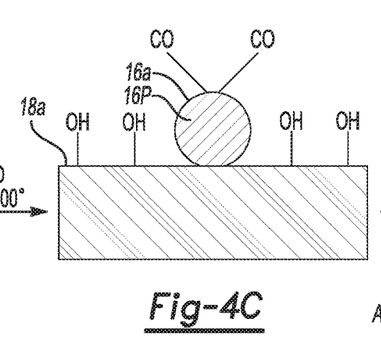

As shown between FIGS. 4A and 4C, the support 18 having the PGM particle(s) 16 dispersed thereon may then be exposed to carbon monoxide (CO). The CO may be introduced alone, or it may be entrained in a carrier gas, such as Ar, He, another inert gas, $N_2$, forming gas, and the like. The concentration of the CO may range from about 2 volume percent (vol %) to about 100 vol %. In examples in which the concentration of the CO is less than 100 vol %, it is to be understood that the balance of the gas flow is the carrier gas.

The flow rate of the CO (either alone or in combination with the carrier gas) may range from about 5 standard cubic centimeters per minute (sccm) to about 50 sccm.

Figure 6A:
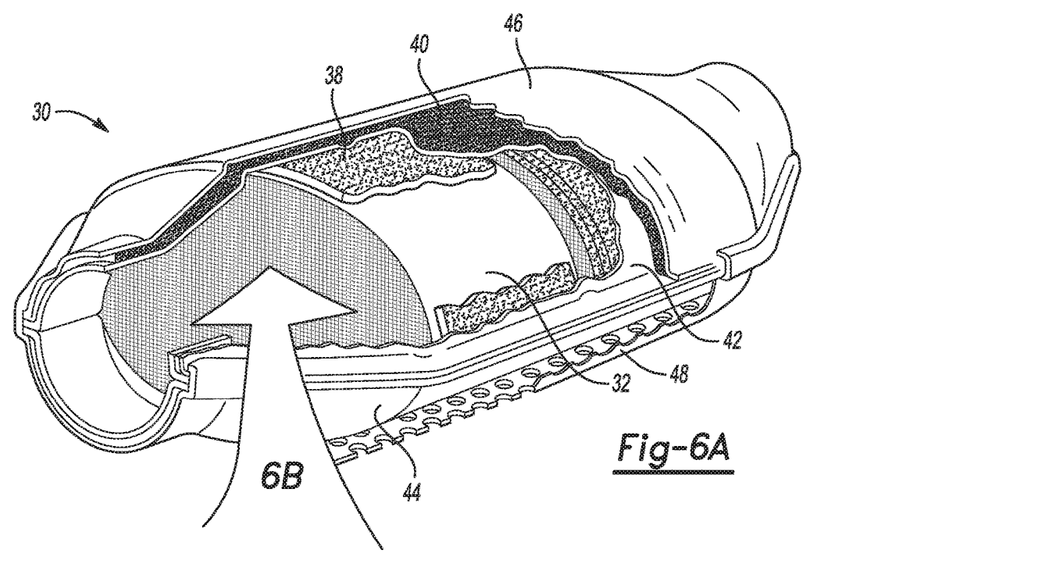
FIG. 6A is a perspective, partially cut-away view of an example of a catalytic converter.
Figure 6B:
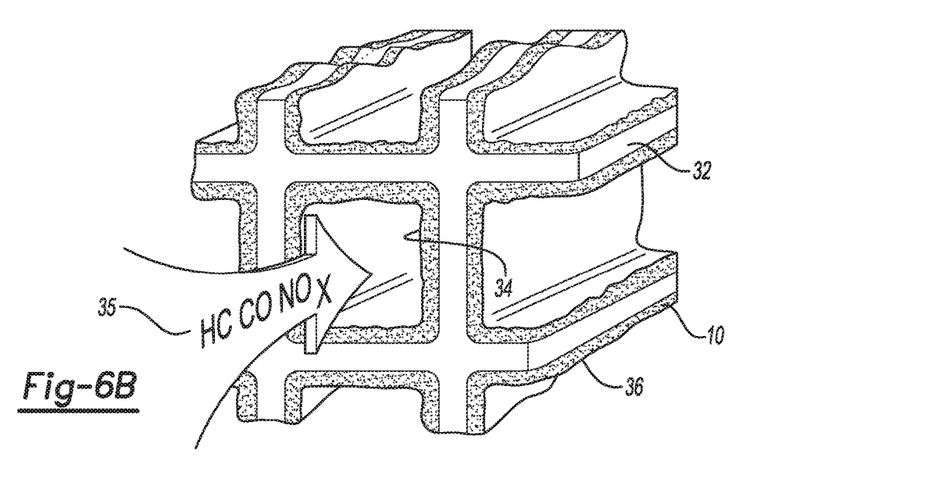
FIG. 6B is an enlarged view of a portion of FIG. 6A.

At temperatures higher than 200° C., the CO may function as a reducing gas to remove the —O and/or —OH groups from the surface of the PGM particle (as shown in FIG. 6B). When CO is introduced at these higher temperatures, it will be appreciated that it will not likely lead to CO absorption on the PGM particles 16. Rather, it will function as a reducing gas to remove the —O and/or —OH groups.

It is to be understood that another reducing gas (including those previously described in reference to FIGS. 3A-3B) may be used to clean the PGM particle surface 16A instead of CO.

Whether reducing with CO or another reducing gas, it is to be understood that at least some of the O atoms and/or —OH groups on the exposed surface 18*a* of the support 18 are not deleteriously affect and remain intact.

As shown between FIGS. 4B and 4C, while the CO is being exposed to the support 18 having the PGM particle(s) 16 dispersed thereon, the temperature may be lowered to 200° C. or less. Alternatively when another reducing gas is used to clean the PGM particle(s) 16, the reducing gas flow may be switched to a CO gas flow and the temperature may be lowered to 200° C. or less. CO absorption onto the PGM particle surface 16*a* occurs at relatively low process temperatures, and thus the temperature may be lowered in order to passivate the PGM particle surface 16*a* with —CO groups. The adsorption of CO onto the PGM particle 16 appears to be due to a similar mechanism for chemisorption-based dispersion measurements.

The passivated PGM particle 16P is shown in FIG. 4C. The absorbed —CO groups passivate the surface 16*a* and render the particle(s) 16P non-reactive during subsequent ALD process steps (which rely on the presence of —OH bonds). The —CO groups do not react during the ALD process steps, and thus the groups prevent the barrier layer(s) 24A from growing/forming on the PGM particle(s) 16.

After the PGM particle surface 16*a* is passivated with —CO groups, ALD is performed to grow the barrier 24 on the support 18*a* around the passivated PGM particle(s) 16P. In the example shown in FIGS. 4A-4E, a first ALD cycle is performed immediately after the passivation to form the first layer 24A of the barrier 24. This first ALD cycle includes a (mixed) metal oxide precursor pulse followed by a water pulse.

ALD includes exposing the passivated PGM particles 16P and the support 18 to a metal oxide precursor or a mixed metal oxide precursor (shown between FIGS. 4C and 4D), and then to water vapor (shown between FIGS. 4D and 4E) to form the first layer 24A of the barrier 24. Each of these exposure steps is self-limiting, because they involve sequential surface chemical reactions with certain functional groups (e.g., —OH). Since the PGM particles 16P have been treated to have —CO surface groups, the first layer 24A of the barrier 24 does not form on the passivated PGM particles 16P.

Figure 4D:
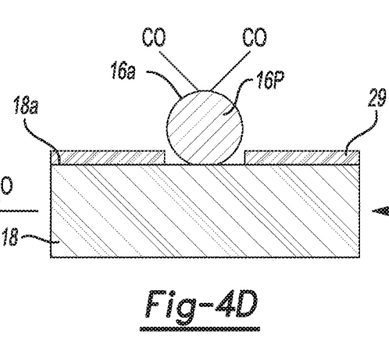

Each of the exposure steps from FIGS. 4C to 4D may be performed at a temperature ranging from room temperature (e.g., from about 18° C. to about 25° C.) to about 250° C., with gas flows within a range of about 5 sccm to about 50 sccm. The temperature of the precursor materials and the water vapor may range from about room temperature to about 100° C.

As shown between FIGS. 4C and 4D, the passivated PGM particles 16P and the support 18 are first exposed to a metal oxide precursor or a mixed metal oxide precursor. The metal oxide precursor shown in the FIGS. 4C-4D is $Al(CH_3)_3$ (i.e., trimethylaluminum). It is to be understood that the metal oxide precursor or the mixed metal oxide precursor that is used will depend upon the desired composition for the barrier 24, and any of the precursors previously described may be used.

When exposed to the metal oxide or mixed metal oxide precursor(s), the precursor(s) reacts with —OH groups on the support 18 to form an intermediate 29 on the exposed portions of the surface 18a. In the example using $Al(CH_3)_3$ as the metal oxide precursor, the $Al(CH_3)_3$ reacts with —OH groups on the support 18, and forms $Al—(CH)_2$ (the intermediate 29) on the exposed portions of the surface 18a.

Then (as shown between FIGS. 4D and 4E), water is introduced. The water is in the form of water vapor, which reacts with the intermediate 29 and forms the desired metal oxide or mixed metal oxide with surface —OH groups. The —CO groups passivate the PGM particle surface 16a, and no —OH groups are formed thereon. After this, one cycle of ALD is completed and one layer 24A of the barrier 24 is formed.

In this example of the method, subsequent barrier layers may be formed on the layer 24A in a variety of ways, which are respectively shown by arrows A, B, and C in FIGS. 4A-4E.

Figure 4E:
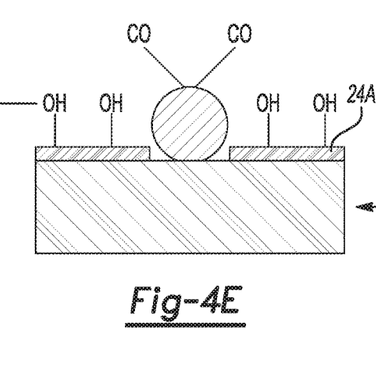

In example A for forming subsequent barrier layers, the ALD steps between FIGS. 4C and 4E may be repeated as many times as necessary, until the desired thickness or height 24h of the barrier 24 is achieved. In one specific example, Eqn. (4), followed by Eqn. (5), may be performed, sequentially until the desired height 24h of the barrier 24 is achieved. In this example, the exposure to CO is used as a pretreatment process prior to performing several cycles of ALD.

Example B for forming subsequent barrier layers utilizes a modified ALD cycle. In this modified ALD cycle, the CO adsorption method can be employed as one step in each ALD cycle, such as by using a CO pulse. In this example, each subsequent barrier layer is formed by exposure to a CO pulse, followed by a (mixed) metal oxide precursor pulse, followed by a water pulse. This may serve to ensure that the PGM particle surface 16a stays passivated throughout the modified ALD process.

Example C for forming subsequent barrier layers also utilizes a modified ALD cycle. In this example, the cycle can return to the cleaning step. At this stage, the reducing gas (CO or another reducing gas at high temperature) may be introduced into the system to clean the surface 16a of the PGM particles 16. The method then proceeds with passivating the PGM particle surface 16a followed by ALD steps to form the subsequent barrier layers. This may serve to ensure that the PGM particle surface 16a stays clean and passivated throughout the modified ALD process.

In the examples shown in FIGS. 4A-4E, once the process for forming the barrier 24 is complete, the catalyst 10 may be heated to above 200° C. or subjected to a vacuum of at least $10^{-2}$ Torr to remove the —CO groups from the surface 16a of the PGM particles 16. In one example, the low partial pressure will remove the —CO groups.

While not shown in FIGS. 4A-4E, it is to be understood that the support 18 having the PGM particles 16 dispersed thereon may be introduced into a chamber, and the various steps of the processes may take place within the chamber.

In the example methods disclosed herein, it has been found that controlling the barrier height 24a is desirable. First, if the height 24h of the barrier 24 extends too far above the height of the particles 16 (e.g., >10X, as described above), the exhaust gas may not be able to reach the PGM particles 16 and catalysis will not work. Second, if the barrier 24 is grown much higher than the adjacent PGM particles 16, then the chemicals used during additional modified ALD cycles will react with —OH groups above the PGM particles 16 (e.g., on the now exposed sides of the barrier 24). This causes the barrier 24 to grow inward and cover or encapsulate the particles 16. As such, the number of ALD cycles or modified ALD cycles may be controlled in order to achieve the desired height 24h for the barrier 24. For example, less than 20 ALD cycles or modified ALD cycles may be used. As one specific example, from 5 ALD cycles or modified ALD cycles to 10 ALD cycles or modified ALD cycles may be used to create the barrier 24.

While not shown, any examples of the method disclosed herein may involve pre-sintering the support 18 at the outset of the method, i.e., before applying the PGM particles 18 to the support 18. Pre-sintering may be accomplished at a temperature ranging from about 900° C. to about 1000° C. Pre-sintering may reduce the surface area of the support 18 prior to formation of the barrier 24. Reducing the surface area of the support 18 means that there may be less of the surface 18a available for the growth of the barrier 24 (and thus less of the barrier 24). Less barrier 24 material reduces the weight increase of the final catalyst 10.

Figure 5:
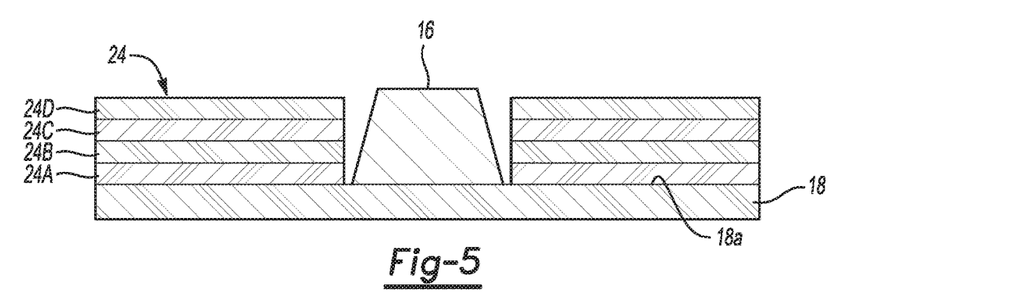
FIG. 5 is a semi-schematic, cross-sectional view depicting an example of the catalyst formed via an example of the method disclosed herein.

FIG. 5 illustrates an example barrier 24 formed via the methods shown in FIGS. 3A-3D or FIGS. 4A-4E. In this example, the barrier 24 that is formed is made up of several $Al_2O_3$ layers 24A, 24B, 24C, 24D and the support 18 is $CeO_2/Al_2O_3$.

The PGM particle 16 is shown without any surface —O, —OH, or —CO groups. As such, the PGM particle 16 has been formed on the surface 18a and reduced as previously described in reference to FIGS. 3A-3D, or has been formed the surface 18a and had —CO groups introduced and then subsequently removed as previously described in reference to FIGS. 4A-4E.

The appropriate steps are repeated as described in FIGS. 3A-3D or 4A-4E to form several layers of $Al_2O_3$ and to create the barrier 24. As illustrated in FIG. 5, the alumina layers 24A, 24B, 24C, 24D formed will selectively deposit on the support surface 18a, and there will be no alumina layers 24A, 24B, 24C, 24D covering the PGM particle 16. This is due to the presence of —OH groups, initially on the surface 18a and subsequently on each layer, and the absence of —OH groups (and in some examples the presence of passivating —CO groups) on the PGM particle 16.

The methods disclosed herein may also be used to maintain the operational temperature of the catalyst 10 over time, and of a catalytic converter in which the catalyst 10 is used.

The catalyst 10 may be applied to a monolith substrate and utilized in a catalytic converter. An example of the catalytic converter is shown in FIG. 6A and an example of the monolith substrate is shown in both FIGS. 6A and 6B.

The catalytic converter 30 includes the monolith substrate 32. The monolith substrate 32 may be formed of a ceramic or a metal alloy that is capable of withstanding high temperatures (e.g., 100° C. or higher). Synthetic cordierite is a magnesium-alumino-silicate ceramic material that is suitable for use as the monolith substrate 32. A ferritic iron-chromium-aluminum alloy is an example of a metal alloy that is suitable for use as the monolith substrate 32. The monolith substrate 32 has a honeycomb or other three-dimensional structure.

An enlarged view of a portion of the monolith substrate 32 is depicted in FIG. 6B. The monolith substrate 32 includes a large number of parallel flow channels 34 to allow for sufficient contact area between the exhaust gas 35 and the catalyst 10 (contained in coating 36) without creating excess pressure losses.

The coating 36 includes the catalyst 10 disclosed herein. In some instances, the coating 36 may also include a binder material (e.g., sol binders or the like). The coating 36 may be applied to the monolith substrate 32 by washcoating or some other similar processes.

Referring back to FIG. 6A, in the catalytic converter 30, the monolith substrate 32 is surrounded by a mat 38, which in turn is surrounded by insulation 40. Upper and lower shells 42, 44 (formed of metal) may be positioned between the mat 38 and the insulation 40. An insulation cover 46 may be positioned over the upper shell 42 and the insulation 40 thereon, and a shield 48 may be positioned adjacent to the lower shell 44 and the insulation 40.

The catalytic converter 30 may be a DOC, which is used in a diesel engine. The DOC is a two way catalytic converter, which eliminates hydrocarbons and CO by oxidizing them, respectively, to water and $CO_2$. The DOC may also exhibit $NO_x$ storage capability during the vehicle cold-start period. In such diesel engines, the reduction of $NO_x$ to water and $N_2$ may take place in a separate unit, and may involve the injection of urea into the exhaust.

The catalytic converter 30 may also be a TWC, which is used in a stoichiometric spark-ignited engine. The TWC is a three way catalytic converter, which reduces NOx to $N_2$, and oxidizes HC and CO, respectively, to water and $CO_2$.

It is to be understood that the ranges provided herein include the stated range and any value or sub-range within the stated range. For example, a range of from about 900° C. to about 1000° C. should be interpreted to include not only the explicitly recited limits of from about 900° C. to about 1000° C., but also to include individual values, such as 925° C., 980° C., etc., and sub-ranges, such as from about 915° C. to about 975° C., etc. Furthermore, when "about" is utilized to describe a value, this is meant to encompass minor variations (up to +/−10%) from the stated value.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

In describing and claiming the examples disclosed herein, the singular forms "a", "an", and "the" include plural referents unless the context clearly dictates otherwise.

While several examples have been described in detail, it is to be understood that the disclosed examples may be modified. Therefore, the foregoing description is to be considered non-limiting.

The invention claimed is:

1. A method of suppressing aging of platinum group metal (PGM) particles in a catalytic converter, the method comprising:
applying PGM particles to a support;
passivating a surface of the PGM particles by exposing the PGM particles to carbon monoxide at a temperature equal to or less than 200° C. to introduce —CO groups to the surface; and
performing atomic layer deposition (ALD) to selectively grow a barrier on the support around the PGM particles.

2. The method as defined in claim 1 wherein the passivating is performed as a pretreatment process prior to performing several cycles of ALD.

3. The method as defined in claim 1 wherein performing ALD includes:
performing, after passivating the surface, a first ALD cycle to form a first layer of the barrier, the first ALD cycle including a metal oxide precursor pulse and a water pulse; and
then performing a modified ALD cycle to form each subsequent layer of the barrier, wherein the modified ALD cycle includes a CO pulse, followed by a metal oxide precursor pulse, followed by a water pulse.

4. The method as defined in claim 1 wherein prior to the passivating, the method further comprises exposing the PGM particles to a reducing gas at a temperature ranging from about 150° C. to about 500° C. or carbon monoxide at a temperature greater than 200° C. to remove —O and —OH groups from the surface.

5. The method as defined in claim 4 wherein the reducing gas is selected from the group consisting of hydrogen gas, ammonia, anhydrous ammonia, aqueous ammonia, urea, and mixtures thereof.

6. The method as defined in claim 4 wherein the reducing gas is present in an amount ranging from about 2 vol % to 100 vol %.

7. The method as defined in claim 6 wherein the reducing gas is entrained in a carrier gas selected from the group consisting of Ar, He, Ne, Kr, Xe, Rn, and $N_2$.

8. The method as defined in claim 1, further comprising removing the —CO groups from the surface of the PGM particles after the barrier is formed.

9. The method as defined in claim 1 wherein a flow rate of the carbon monoxide ranges from about 5 sccm to about 50 sccm.

10. The method as defined in claim 1 wherein the carbon monoxide is present in an amount ranging from about 2 vol % to 100 vol %.

11. The method as defined in claim 10 wherein the carbon monoxide is entrained in a carrier gas selected from the group consisting of Ar, He, Ne, Kr, Xe, Rn, and $N_2$.

12. The method as defined in claim 1 wherein the ALD is performed with a metal oxide precursor selected from the group consisting of trimethylaluminum, triisobutylaluminum, tris(dimethylamido)aluminum(III), aluminum tris(2,2,6,6-tetramethyl-3,5-heptanedionate), bis(cyclopentadienyl)zirconium(IV) dihydride, tris(i-propylcyclopentadienyl)cerium, bis(methyl-$\eta^5$-cyclopentadienyl)methoxymethylzirconium, dimethylbis(pentamethylcyclopentadienyl)zirconium(IV), tetrakis(dimethylamido)zirconium(IV), tetrakis(ethylmethylamido)zirconium(IV), zirconium(IV) dibutoxide(bis-2,4-pentanedionate) solution, zirconium(IV) 2-ethylhexanoate, zirconium tetrakis(2,2,6,6-tetramethyl-3,5-heptanedionate), (3-aminopropyl)triethoxysilane, N-sec-butyl(trimethylsilyl)amine, chloropentamethyldisilane, 1,2-dichlorotetramethyldisilane, 1,3-diethyl-1,1,3,3-tetramethyldisilazane, 1,2-dimethyl-1,1,2,2-tetraphenyldisilane, dodecamethylcyclohexasilane, hexamethyldisilane, 2,4,6,8,10-pentamethylcyclopentasiloxane, pentamethyldisilane, silicon tetrabromide, silicon tetrachloride, tetraethyl silane, 2,4,6,8-tetramethylcyclotetrasiloxane, 1,1,2,2-tetramethyldisilane, tetramethylsilane, N,N',N"-tri-tert-butylsilanetriamine, tris(tert-butoxy)silanol, tris(tert-pentoxy)silanol, tetrakis(diethylamido)titanium(IV), tetrakis(dimethylamido)titanium(IV), tetrakis(ethylmethylamido)titanium(IV), titanium(IV) diisopropoxidebis(2,2,6,6-tetramethyl-3,5-heptanedionate), titanium(IV) isopropoxide, titanium tetrachloride, bis(cyclopentadienyl)magnesium(II), bis(pentamethylcyclopentadienyl)magnesium, bis(pentafluorophenyl)zinc, bis(2,2,6,6-tetramethyl-3,5-heptanedionato)zinc(II), diethylzinc, barium bis(2,2,6,6-tetramethyl-3,5-heptanedionate) hydrate, barium nitrate, bis(pentamethylcyclopentadienyl)barium tetrahydrofuran adduct, bis(triisopropylcyclopentadienyl)barium tetrahydrofuran adduct, calcium bis(6,6,7,7,8,8,-heptafluoro-2,2-dimethyl-3,5-octanedionate), calcium bis(2,2,6,6-tetramethyl-3,5-heptanedionate), and combinations thereof.

13. The method as defined in claim 1 wherein the ALD is performed with a mixed metal oxide precursor including a lanthanum precursor and an other metal oxide precursor selected from the group consisting of an iron precursor, an aluminum precursor, a cerium precursor, a strontium precursor, a manganese precursor, a cobalt precursor, and combinations thereof.

14. A method of suppressing aging of platinum group metal (PGM) particles in a catalytic converter, the method comprising:
    applying PGM particles to a support;
    performing a modified atomic layer deposition (ALD) process to selectively grow a first layer of a barrier on the support around the PGM particles, the modified ALD process including:
        exposing the PGM particles and the support to a reducing gas at a temperature ranging from 150° C. to 500° C. or to carbon monoxide at a temperature greater than 200° C., thereby removing —O and —OH groups from a surface of the PGM particles and leaving at least some —OH groups on a surface of the support intact, the reducing gas being selected from the group consisting of hydrogen gas, ammonia, anhydrous ammonia, aqueous ammonia, urea, and mixtures thereof;
        exposing the PGM particles and the support to a metal oxide precursor or a mixed metal oxide precursor using a hydrogen-containing carrier gas; and
        exposing the PGM particles and the support to water vapor; and
    repeating the modified ALD process to selectively grow a subsequent layer of the barrier.

15. The method as defined in claim 14 wherein the metal oxide precursor is selected from the group consisting of trimethylaluminum, triisobutylaluminum, tris(dimethylamido)aluminum(III), aluminum tris(2,2,6,6-tetramethyl-3,5-heptanedionate), bis(cyclopentadienyl)zirconium(IV) dihydride, tris(i-propylclopentadienyl)cerium, bis(methyl-$\eta^5$-cyclopentadienyl)methoxymethylzirconium, dimethylbis(pentamethylcyclopentadienyl)zirconium(IV), tetrakis(dimethylamido)zirconium(IV), tetrakis(ethylmethylamido)zirconium(IV), zirconium(IV) dibutoxide(bis-2,4-pentanedionate) solution, zirconium(IV) 2-ethylhexanoate, zirconium tetrakis(2,2,6,6-tetramethyl-3,5-heptanedionate), (3-aminopropyl)triethoxysilane, N-sec-butyl(trimethylsilyl)amine, chloropentamethyldisilane, 1,2-dichlorotetramethyldisilane, 1,3-diethyl-1,1,3,3-tetramethyldisilazane, 1,2-dimethyl-1,1,2,2-tetraphenyldisilane, dodecamethylcyclohexasilane, hexamethyldisilane, 2,4,6,8,10-pentamethylcyclopentasiloxane, pentamethyldisilane, silicon tetrabromide, silicon tetrachloride, tetraethylsilane, 2,4,6,8-tetramethylcyclotetrasiloxane, 1,1,2,2-tetramethyldisilane, tetramethylsilane, N,N',N''-tri-tert-butylsilanetriamine, tris(tert-butoxy)silanol, tris(tert-pentoxy)silanol, tetrakis(diethylamido)titanium(IV), tetrakis(dimethylamido)titanium(IV), tetrakis(ethylmethylamido)titanium(IV), titanium(IV) diisopropoxidebis(2,2,6,6-tetramethyl-3,5-heptanedionate), titanium(IV) isopropoxide, titanium tetrachloride, bis(cyclopentadienyl)magnesium(II), bis(pentamethylcyclopentadienyl)magnesium, bis(pentafluorophenyl)zinc, bis(2,2,6,6-tetramethyl-3,5-heptanedionato)zinc(II), diethylzinc, barium bis(2,2,6,6-tetramethyl-3,5-heptanedionate) hydrate, barium nitrate, bis(pentamethylcyclopentadienyl)barium tetrahydrofuran adduct, bis(triisopropylcyclopentadienyl)barium tetrahydrofuran adduct, calcium bis(6,6,7,7,8,8,-heptafluoro-2,2-dimethyl-3,5-octanedionate), calcium bis(2,2,6,6-tetramethyl-3,5-heptanedionate), and combinations thereof.

16. The method as defined in claim 14 wherein the mixed metal oxide precursor includes a lanthanum precursor and an other metal oxide precursor selected from the group consisting of an iron precursor, an aluminum precursor, a cerium precursor, a strontium precursor, a manganese precursor, a cobalt precursor, and combinations thereof.

17. The method as defined in claim 14 wherein the reducing gas or carbon monoxide is present in an amount ranging from about 2 vol % to 100 vol %.

18. The method as defined in claim 17 wherein the reducing gas is entrained in a carrier gas selected from the group consisting of Ar, He, Ne, Kr, Xe, Rn, and $N_2$.

19. The method as defined in claim 14 wherein a flow rate of the reducing gas or carbon monoxide ranges from about 5 sccm to about 50 sccm.

* * * * *